United States Patent
Yoneda

(10) Patent No.: US 7,147,977 B2
(45) Date of Patent: Dec. 12, 2006

(54) METHOD FOR FABRICATING SEMICONDUCTOR DEVICE AND METHOD FOR FABRICATING SEMICONDUCTOR SUBSTRATE USED IN THE SEMICONDUCTOR DEVICE

(75) Inventor: Kenji Yoneda, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 85 days.

(21) Appl. No.: 10/833,037

(22) Filed: Apr. 28, 2004

(65) Prior Publication Data

US 2005/0014386 A1    Jan. 20, 2005

(30) Foreign Application Priority Data

Jul. 18, 2003   (JP)   ............................. 2003-277036

(51) Int. Cl.
*G03C 5/00*   (2006.01)
(52) U.S. Cl. ......................................... 430/30; 430/311
(58) Field of Classification Search .................. 430/30, 430/311
See application file for complete search history.

(56) References Cited

U.S. PATENT DOCUMENTS 5,494,862 A * 2/1996 Kato et al. .................. 438/693
5,895,966 A * 4/1999 Penchuk ..................... 257/690

OTHER PUBLICATIONS

Fujisawa et al., "Analysis of Wafer Flatness for CD Control in Photolithography", *Optical Microlithography XV*, Proceedings of SPIE vol. 4691 (2002), pp. 802-809.

* cited by examiner

*Primary Examiner*—Christopher G. Young
(74) *Attorney, Agent, or Firm*—McDermott Will & Emery LLP

(57) ABSTRACT

A wafer is held on a pin chuck, and thereafter a design pattern is transferred to the principal surface of the wafer by exposing an exposure light, which passes through a mask having the design pattern, onto the principal surface of the held wafer. The underlying surface of the wafer has irregularities with cross-sectional cycle lengths of 300 μm or more and depressions with opening diameters of 100 μm or less, and is formed such that an arithmetic mean of depths of the irregularities and depths of the depressions is 200 nm or less. The differences in distance between a focal position of the exposure light and the principal surface of the wafer held on the pin chuck are set at 50% or less of a design rule.

4 Claims, 14 Drawing Sheets

UNIT IN μm

UNIT IN μm

METHOD FOR FABRICATING SEMICONDUCTOR DEVICE AND METHOD FOR FABRICATING SEMICONDUCTOR SUBSTRATE USED IN THE SEMICONDUCTOR DEVICE

BACKGROUND OF THE INVENTION

The present invention relates to method for fabricating a semiconductor device that transfers design pattern to the principal surface of a semiconductor substrate by an exposure light that passes through a mask having the design pattern, and method for fabricating the semiconductor substrate used in the semiconductor device.

The down sizing of MOS-type (metal-oxide-semiconductor) semiconductor device in the recent years has resulted in a strong need for miniaturizing process that reduces the width of wiring. Specifically, the technique of forming a miniaturized resist pattern using photolithography is most important to the miniaturizing process. In forming of a miniaturized pattern, the improvement of resolution is generally attempted by reducing the wavelength of the exposure light and/or increasing the NA (numerical aperture) of the exposure lens. However, the reduction in the wavelength of the exposure light and the increase in the NA of the exposure lens decrease the depth of focus of the exposure light, and thus a sufficient depth of focus cannot be attained.

As a result, one of the important factors in the miniaturizing process resides in maintaining a uniform distance between the lens and the semiconductor substrate (wafer) of which surface is to be exposed to the exposure light, at each position above the wafer. The focal point of the exposure light can be adjusted by mechanically correcting the focal distance such as tilting the stepper stage with respect to the focal distance. However, such mechanism for correcting the focal distance can only be applied with respect to one shot of one exposure, and since the correction within the sort is not possible, the uniformity of focal distance within the shot becomes extremely crucial. Generally, the exposure region (site) of a shot has a dimension of 25 mm×25 mm in the stepper and 26 mm×8 mm in the scanner stepper.

The factors that determine the precision of the focus depend on the lens and the stage operation mechanism. In addition, the step resulted from the pattern formed on the principal surface of the wafer before exposure also affects the precision of the focus. Hence, a flat wafer of which principal surface having the smallest deviation from the virtual plane (an ideal exposure surface) and the smallest deviation with respect to the focal position is required. As a result, conventionally, a wafer of which flatness is being increased to a high level of substantially the same as the design rule is used to solve the problem of the decrease in depth of focus. Accordingly, the conventional flat wafer is basically a wafer having a small variation in thickness, and when a wafer having a small variation in thickness is held on a stepper stage, the deviation between the principal surface of the wafer and the focal plane becomes small and thus a high precision pattern can be formed.

However, after various investigations, the applicant of the present invention discovered that the deviation between the principal surface of the wafer and the focal plane does not merely depends on the uniformity of thickness of the wafer, but rather on how the principal surface of the wafer is positioned with respect to the optical system in the stepper when the wafer is held on the stepper stage. In other words, improving the uniformity of thickness of the wafer with which the exposure light does not come in contact may not achieve the miniaturizing process.

The problems between the conventional wafer and the stage holding the wafer are describe below with reference to the drawings.

FIGS. 14A to 14C schematically illustrate the case in which a conventional wafer having a high level of flatness and of which deviation of thickness is being kept to its smallest is held on a stage.

As shown in FIG. 14A, the film thickness of a wafer 100 is uniform and if the wafer 100 is an ideal wafer having no irregularity on the top and the underlying surfaces, no problem will occur. Moreover, if a stage 200 also has an ideal flatness, even if there are slight irregularities in the wafer, the irregularities can be flattened when the wafer is compressed onto the stage 200. Hence, values A, B, C, D of the deviation between the principal surface of the wafer 100 and the virtual focal plane 50 are equal.

However as shown in FIG. 14B, even though the values E, F, G, H of thickness measured at various points of the wafer 100 are equal, slight irregularities actually occurs on the conventional wafer 100 that is supposed to have a high level of flatness. Wafer on which irregularities occur such as the wafer 100 is known as snake wafer. Moreover, the conventional stage 200 also does not have an ideal flatness or a complete absorption.

FIG. 14C illustrates the conventional wafer 100 with irregularities being held on a pin chuck of the stepper stage 210. Accordingly, when the wafer 100 is compressed and held onto the pin chuck by vacuum absorption, the deviation may worsen depending on the condition of the underlying surface of the wafer 100. Hence, the most important concern in a photolithography process is to determine the flatness of the wafer 100 based not on the uniformity of the thickness of the wafer 100, but on the deviation of the thickness of the wafer from the virtual focal plane 50 when the wafer 100 is being held on the pin chuck of the stepper stage 210. The deviation not only depends on the condition and shape of the underlying surface of the wafer 100, but also greatly depends on the type and shape of the stepper stage 210.

Hence even if there is no thickness variation in the wafer 100, due to the relation between the shape of the underlying surface of the wafer 100 and the stepper stage 210, the top surface of the pin 211 and/or the seal portion 212, some of the pins 211 do not come in contact with the underlying surface of the wafer 100 and all the values A, B, C, D of the deviation with the virtual focal plane 50 are different. In other words, the principal surface of the wafer 100 held on the stepper stage 210 cannot be considered as flat.

Further, the flatness of the wafer 100 is conventionally determined by focusing on the uniformity of the thickness (variation of the thickness). The flatness is determined by measuring the thickness of the wafer by electrical method using capacitance or optical method using Fizeau interferometer under the condition in which the wafer 100 is in a free state and not being held on the stage. Moreover, the flatness of the principal surface of the wafer 100 is determined by absorbing and entirely leveling the underlying surface of the wafer 100 according to the chuck (stage) having an ideally flat surface. These measuring methods merely measure the thickness variation of the wafer 100, and the flatness determined from such thickness variation of the wafer 100 does not ensure the depth of focus during the actual exposure on the stepper.

Due to the foregoing reasons, it is very difficult to form a miniaturized and high precision lithography pattern on the conventional wafer 100 held on the wafer stage 210. In other words, by using the conventional methods that merely assume the uniformity in thickness of the wafer 100 implies the flatness of the wafer 100, fabrication of semiconductor device belonging to the generation having a design rule of 0.15 μm or less with high precision is extremely difficult.

SUMMARY OF THE INVENTION

An object of the present invention is to solve the aforementioned conventional problem, and to prevent the occurrence of deviation on the principal surface of the semiconductor substrate (wafer) held on the stage with respect to the virtual focal plane of the exposure light in photolithography.

In order to achieve this object, in the present invention, the cycle length of the irregularities on the underlying surface of a semiconductor substrate used in a semiconductor device, the depth of the depressions smaller than the irregularities and the mean of the two are provided at the minimum, and the flatness of the principal surface of the semiconductor substrate, which is held on a substrate stage, is 100 nm or less.

Specifically, the method for fabricating the semiconductor device according to the present invention includes the steps of (a) holding a semiconductor substrate on a substrate stage; and (b) transferring a design pattern onto the principal surface of the semiconductor substrate by exposing an exposure light, passing through a mask having the design pattern, to the principal surface of the semiconductor substrate held on the substrate stage, wherein an underlying surface, which is the surface opposite to the principal surface of the semiconductor substrate, has irregularities with cross-sectional cycle lengths of 300 μm or more and depressions with opening diameters of 100 μm or less, and is formed such that an arithmetic mean of depths of the irregularities and depths of the depressions is 200 nm or less, and in the step (b), differences in distance between a focal position of the exposure light and the principal surface of the semiconductor substrate held on the substrate stage are set at 50% or less of a design rule.

According to the method for fabricating the semiconductor device of the present invention, since the deviation between the principal surface of the semiconductor substrate and the virtual focal plane of the exposure light (optical system) are decreased, the margin of the focal position can be increased even when the design rule is a miniaturized pattern of 0.15 μm or less.

In the method for fabricating the semiconductor device of the present invention, it is preferable that the principal surface of the semiconductor substrate is partitioned into a plurality of quadrilateral sites, the step (b) further includes a sub-step of sequentially exposing each partitioned site to the exposure light, and among the plurality of sites of which each center is included on the principal surface of the semiconductor substrate, differences in distance between a virtual focal plane of the exposure light and the principal surface of the semiconductor substrate held on the substrate stage are 120% or less of a design rule determining the design pattern, when displayed by a Site Flatness Front Side Reference Least Square Range (SFQR) method.

Hence, the deviation between the focal position of the exposure light and the principal surface of the semiconductor substrate held on the substrate stage can be set at 50% or less of the design rule.

In the step (b) of the method for fabricating the semiconductor device of the present invention, it is preferable that a substrate support portion of the substrate stage uniformly contacts the underlying surface of the semiconductor substrate.

It is also preferable that the semiconductor substrate is compressed onto the substrate support portion of the substrate stage by atmospheric pressure, and the substrate support portion is a pin chuck composed of a plurality of pin-shaped components or a ring chuck composed of a plurality of concentric components, each pin-shaped component or concentric component is provided apart from each other such that the top surface of each pin-shaped component or concentric component opposes the underlying surface of the semiconductor substrate.

According to the present invention, a method for fabricating a semiconductor substrate having at least a principal surface and an underlying surface, which is the surface opposite to the principal surface, on which a silicon layer is respectively provided, includes the steps of (a) performing a wet etching to the underlying surface of the semiconductor substrate using an alkaline solution to remove damages caused by the slicing of the underlying surface; (b) after the step (a), polishing the underlying surface of the semiconductor substrate by a thickness of between 0.05 μm and 1 μm; and (c) after the step (b), polishing the principal surface of the semiconductor substrate until the principal surface becomes a mirror surface.

According to the method for fabricating the semiconductor substrate, since the underlying surface, which is the surface opposite to the principal surface of the semiconductor substrate, has irregularities with cross-sectional cycle lengths of 300 μm or more and depressions with opening diameters of 100 μm or less, and is formed such that an arithmetic mean of depths of the irregularities and depths of the depressions is 200 nm or less, a semiconductor substrate that can be used in the method for fabricating the semiconductor device of the present invention can be achieved.

In the method for fabricating the semiconductor substrate of the present invention, it is preferable that the step (b) includes a sub-step of polishing the underlying surface of the semiconductor substrate until the underlying surface becomes a mirror surface.

In the method for fabricating the semiconductor substrate of the present invention, it is preferable that the semiconductor substrate is made of bulk silicon.

In the method for fabricating the semiconductor substrate of the present invention, it is preferable that the semiconductor substrate is a SOI substrate composed of an upper silicon layer exposing the principal surface, an insulating layer formed below the upper silicon layer, and a lower silicon layer formed below the insulating layer and exposing the underlying surface.

As described above, according to the method for fabricating the semiconductor device and the method for fabricating the semiconductor substrate used in the semiconductor device of the present invention, since the deviation between the principal surface of the semiconductor substrate and the virtual focal plane of the optical system can be decreased, the margin of the focal position can be increased and the patterning precision improved, even for miniaturized pattern having a design rule of 0.15 μm or less. As a result, since desirable design patterns can be transferred to the semiconductor substrate, a high performance and high reliability semiconductor device having a miniaturized design pattern (device pattern) can be achieved.

DETAILED DESCRIPTION OF THE INVENTION (First Embodiment)

Hereinafter, the first embodiment of the present invention is described with reference to the drawings.

Figure 1:
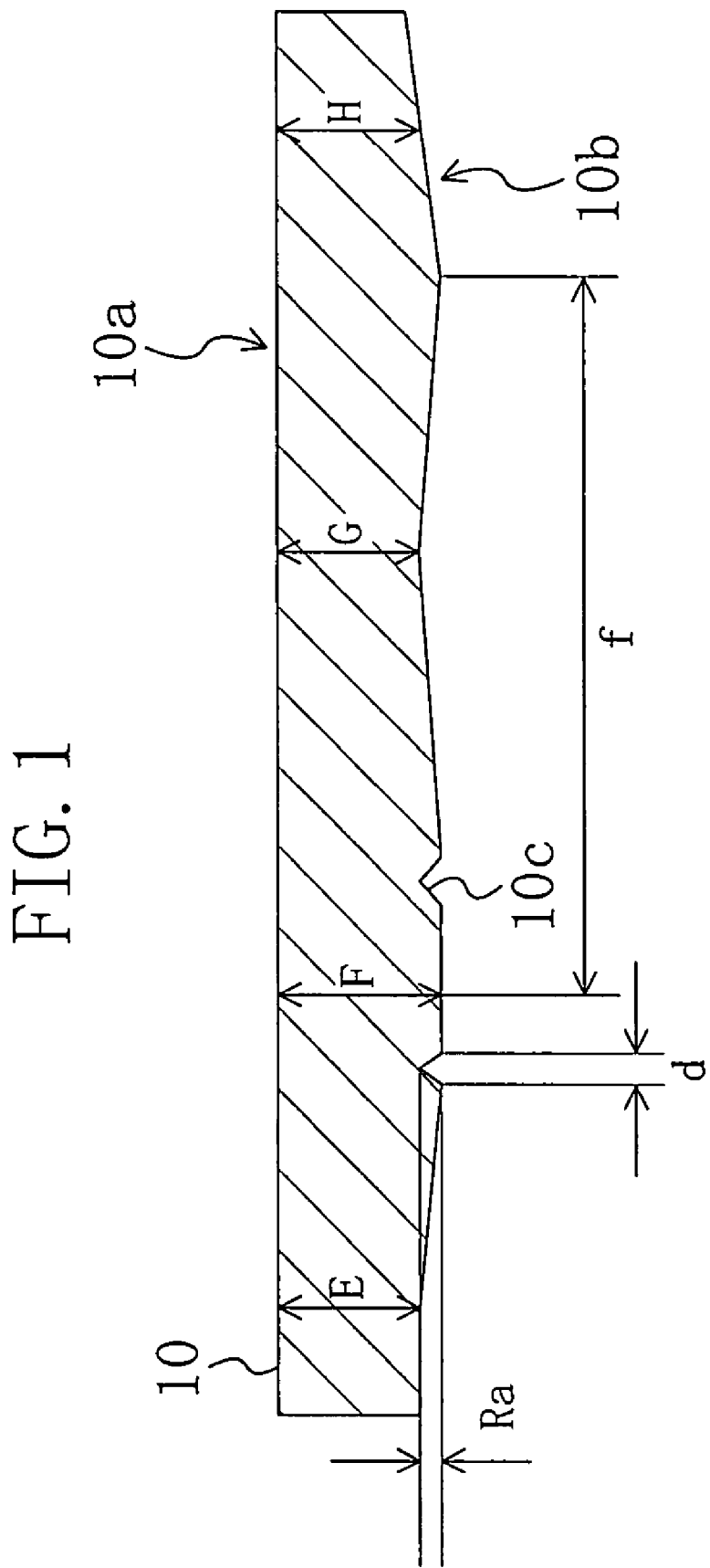
FIG. 1 is a cross-sectional illustration showing a semiconductor substrate (wafer) used in a method for fabricating a semiconductor device according to the first embodiment of the present invention.

FIG. 1 illustrates a cross-sectional structure of a wafer used in a method for fabricating a semiconductor device according to the first embodiment of the present invention.

As shown in FIG. 1, a wafer 10 is composed of silicon (Si) having a diameter of, for example, 200 mm, and the principal surface 10a is processed into a mirror surface. The conditions for processing the underlying surface 10b on the opposite side of the principal surface 10a includes: an average cycle length f of cross-sectional irregularities having a relatively large cycle length is 300 μm, the underlying surface 10b is produced by wet etching, a diameter d of the opening of a pit 10c smaller than the irregularities is 50 μm, and a depth Ra of the pit 10c is 150 nm. Hence, the values of the thickness E, F, G, H measured at various points of the principal surface 10a on the wafer 10 of the first embodiment are not equal to each other. The size and concentration of the pit 10c and the cycle length f of the irregularities can be controlled by regulating the composition of an alkaline solution and the polishing rate of the underlying surface 10b after being etched by the alkaline solution. The specific method for fabricating the wafer 10 is described in the second embodiment.

In the underlying surface 10b of the wafer 10 of the first embodiment, the optimal values of the cycle length f of the irregularities, and the concentration and depth Ra of the pit 10c vary according to the shape of a chuck, thus such as the shape and dimension of each pin top and the distances between the pin tops, composing a stepper stage used in an exposure step. Hence, the parameters of the process conditions for the underlying surface 10b of the wafer are required to be determined in advance, such that the underlying surface 10b is in its most flat state on the pin chuck.

Figure 2:
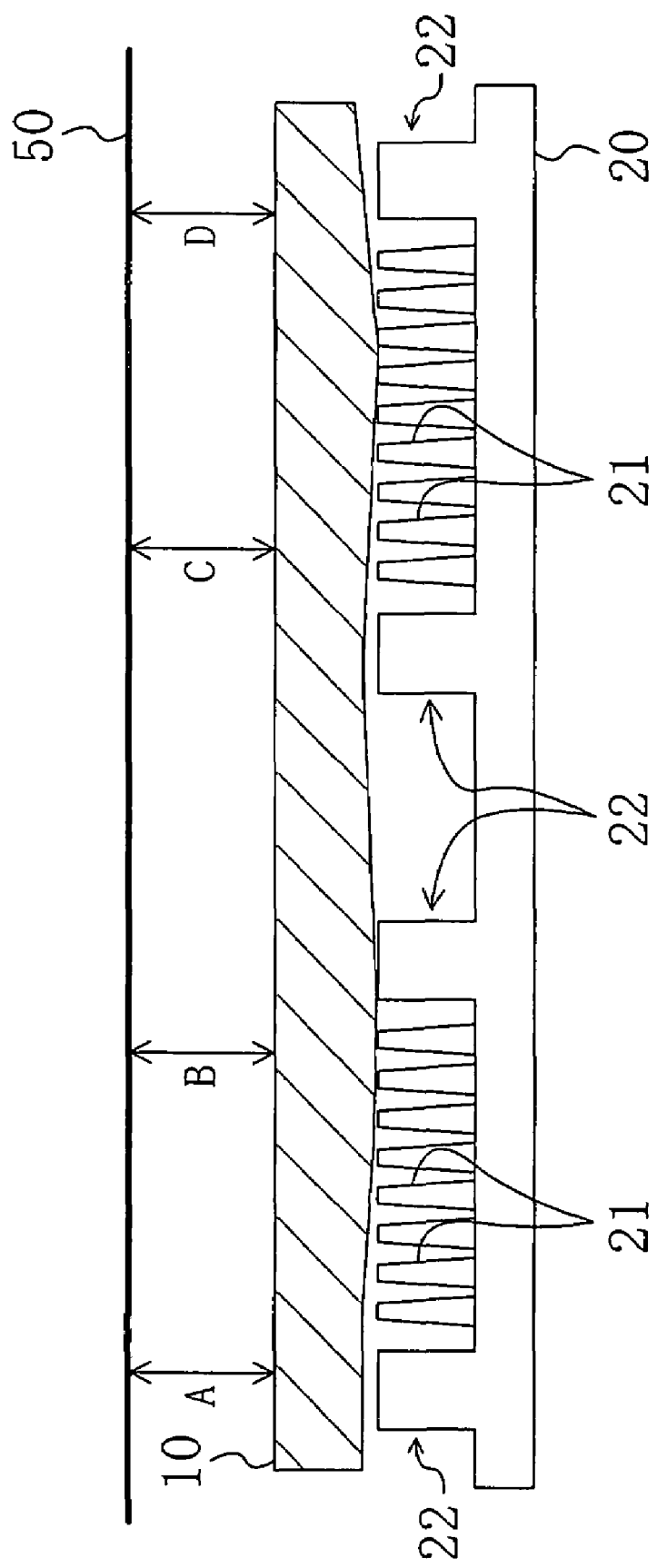
FIG. 2 is a method for fabricating a semiconductor device according to the first embodiment of the present invention, and a cross-sectional illustration showing a schematic structure in which a semiconductor substrate is held on a stage.

FIG. 2 relates to a method for fabricating the semiconductor device in the first embodiment, and schematically illustrates a cross-sectional structure of a state in which the wafer of the present invention is held on a stepper stage.

As shown in FIG. 2, in the first embodiment, a pin chuck 20 is used as a stepper stage for holding the wafer 10 in the stepper (exposure device) used in an exposure step. A plurality of support pins 21 for supporting the underlying surface 10b of the wafer 10 are provided on the entire pin chuck 20 other than the central and peripheral portions. An attaching/detaching region, in which a protruding pin (not shown in the drawing) that enables the wafer to be attached/detached by lifting the underlying surface 10c of the wafer 10 moves in-between, is provided in the central portion of the pin chuck 20. In addition, a planar-ring shaped seal portion 22 is provided in the peripheral portion of the pin chuck 20, such that the wafer 10 is compressed against each support pin 21 by atmospheric pressure, and a planar-quadrangle seal portion 22 is provided around the attaching/detaching region so as to maintained the degree of vacuum in the space on the underlying surface 10b side of the wafer 10.

As shown in FIG. 2, the wafer 10 is supported on the pin chuck 20 by contacting with the top surface of each support pin 21. However, support pin 21 that does not come in contact with the pin top will appear due to the shape of the underlying surface 10b of the wafer 10, for example, the roughness of the underlying surface 10b, the degree of irregularity and the cycle length f of the irregularities. For example, the deviation with respect to a virtual focal plane 50 of the principal surface 10a of the wafer 10 varies greatly in the case when the support pin 21 is in contact with a depression portion and a protruding portion of the underlying surface 10b. Moreover, the wafer 10 is not being supported on the pin chuck 20 at regions in which no support pin 21 is provided, such as the attaching/detaching region and the peripheral portion.

Accordingly, the wafer 10 of the first embodiment can control the offset from the virtual focal plane 50, which is a plane virtually indicating the focal plane of the exposure light in the exposure step, and the underlying surface 10b of the wafer 10 is processed such that the each value of the deviation A, B, C, D based on the virtual focal plane 50 is minimized. Hence, the underlying shape of the wafer 10 is determined according to the wafer stage in actual usage.

Figure 3:
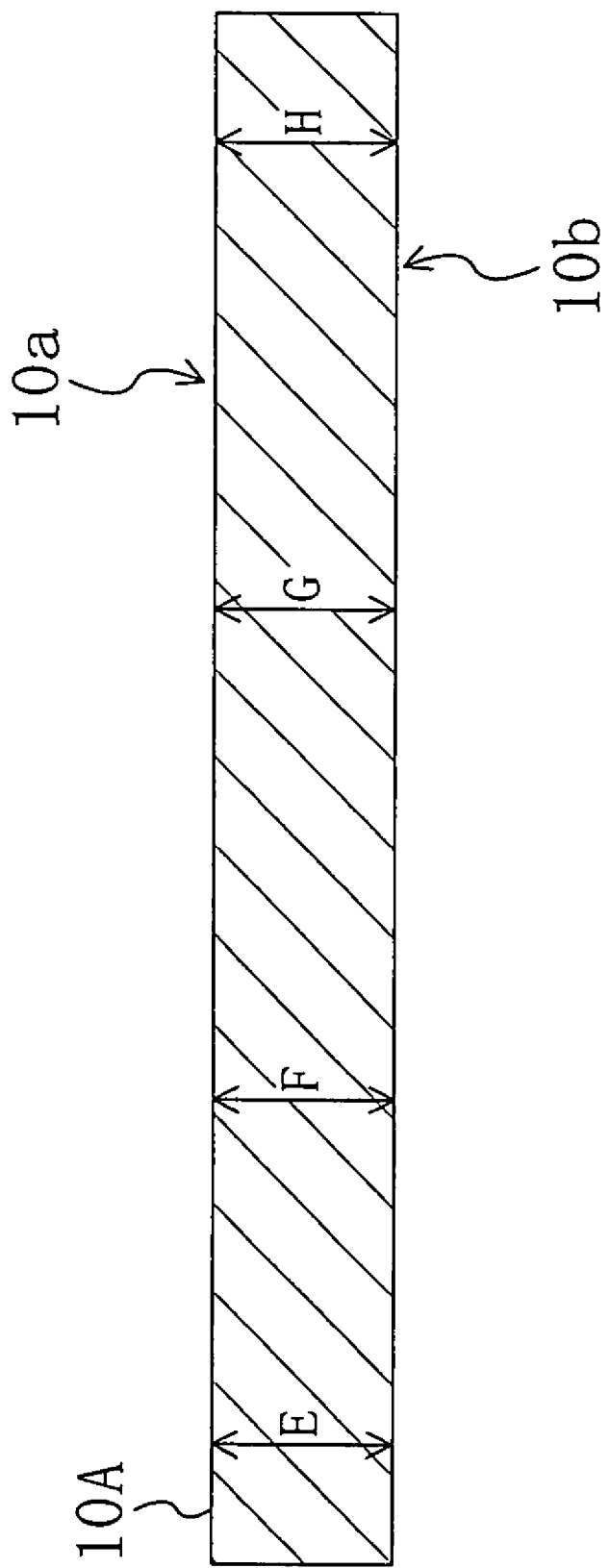
FIG. 3 is a cross-sectional illustration showing an ideal semiconductor substrate.

In consideration of an ideal wafer 10A having a flatness shown in FIG. 3, the principal surface 10a and the underlying surface 10b each has a completely planar surface, and the wafer 10A is completely flat without irregularity as a whole. In the case when such ideal wafer 10A is held on the pin chuck 20, if the position of the pin top of each support pin 21 of the pin chuck 20 is formed on one plane, the offset between the principal surface 10a of the wafer 10A and the virtual focal plane 50, and/or each value of the deviation A, B, C, D become equal, and the wafer 10A can be considered as perfectly flat.

However, the wafer 10 of the first embodiment shown in FIG. 1 is not an ideal wafer 10A, but a realistic wafer, and even if the surface 10a is flat, the underlying surface 10b may not be mirror polished. Moreover, even if the underlying surface 10b is mirror polished, the flatness is inferior to that of the surface 10a. On the other hand, when such wafer is held on the pin chuck 20 shown in FIG. 2, the values of the deviation A, B, C, D from the virtual focal plane 50 may be equal because there is a possibility that A=B=C=D. In such a case, not only when the case in which each value of the deviation is completely equal, but deviation of less than or equal to 100 nm or 50 nm will also substantially be considered as equal.

Hence, this is the feature of the present invention in which the value of each deviation A, B, C, D becomes substantially equal due to the interaction between the underlying surface 10b of the wafer 10 and the support pin 21 of the pin chuck 20. As described above, the thickness of the wafer 10 of which values of thickness E, F, G, H are each different seems uniform due to the interaction with the support pin 21 on the pin chuck 20, and a flatness substantially equivalent to that of an ideally flat wafer 10A can be achieved. By utilizing such wafer 10 in the fabrication of semiconductor device, the various following effects can be achieved.

Method for evaluating the flatness of the wafer according to the first embodiment is described as follows.

Figure 14A:
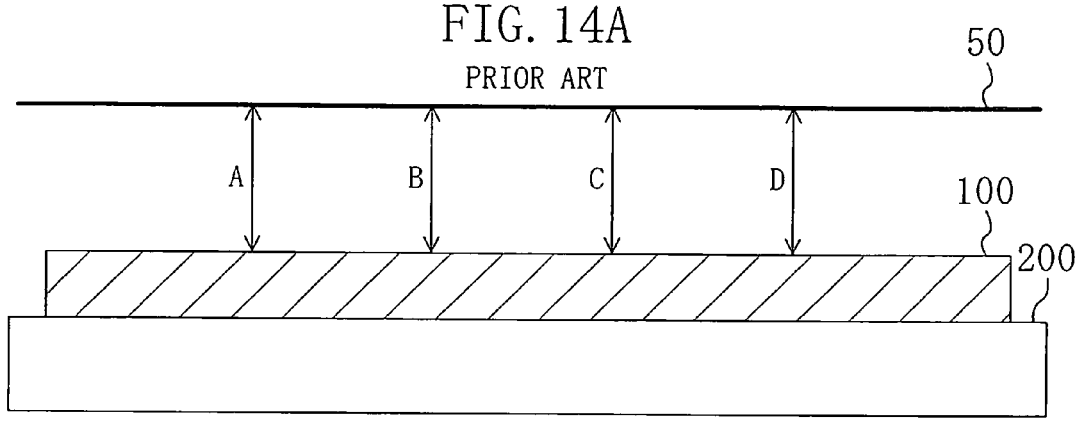
FIG. 14A is a cross-sectional illustration showing a conventional semiconductor substrate held on a stage having an ideally flat supporting surface.
Figure 14B:
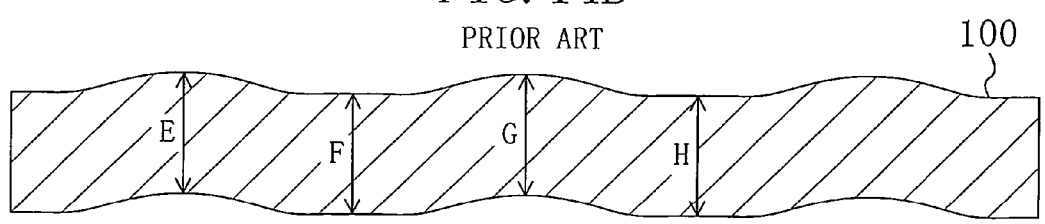
FIG. 14B is a cross-sectional illustration showing a semiconductor substrate having a conventionally high level of flatness.
Figure 14C:
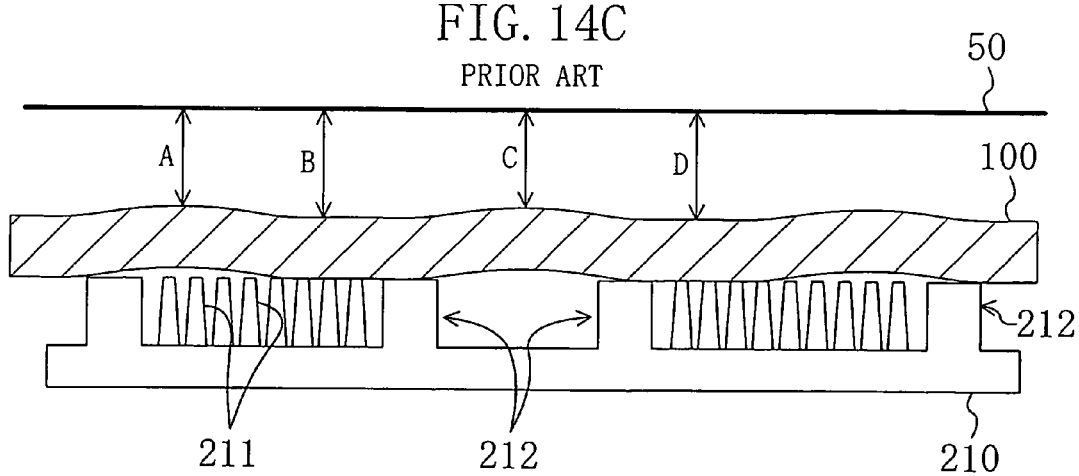
FIG. 14C is a cross-sectional illustration showing a conventional semiconductor substrate held on a conventional stage.

The deviation of the wafer 10 of the present invention shown in FIG. 1 and that of the conventional wafer 100 shown in FIG. 14B from the virtual plane are evaluated respectively.

Firstly, the deviation from the virtual plane determined from the uniformity of the thickness of the wafer 10 in the present invention and that of the conventional wafer 100 are obtained. Here, a Site Flatness Front Side Reference Least Square Range (SFQR) method is used. The dimension of the site is set at 22.5 mm×22.5 mm. In the first embodiment, the dimension of this site is equal to that of the stepper shot.

The SFQR method is a method that calculates the sum of the absolute value of the largest positive and negative deviation with respect to the virtual plane in each site. The subject wafer to be measured is sandwiched by a pair of parallel-plate electrodes with air trapped in-between, and the capacitance between the electrodes is measured under this state in which the wafer is being sandwiched. Accordingly, the thickness of the wafer is obtained and this irregular thickness is recalculated based on the underlying surface of the wafer being flat.

Figure 4:
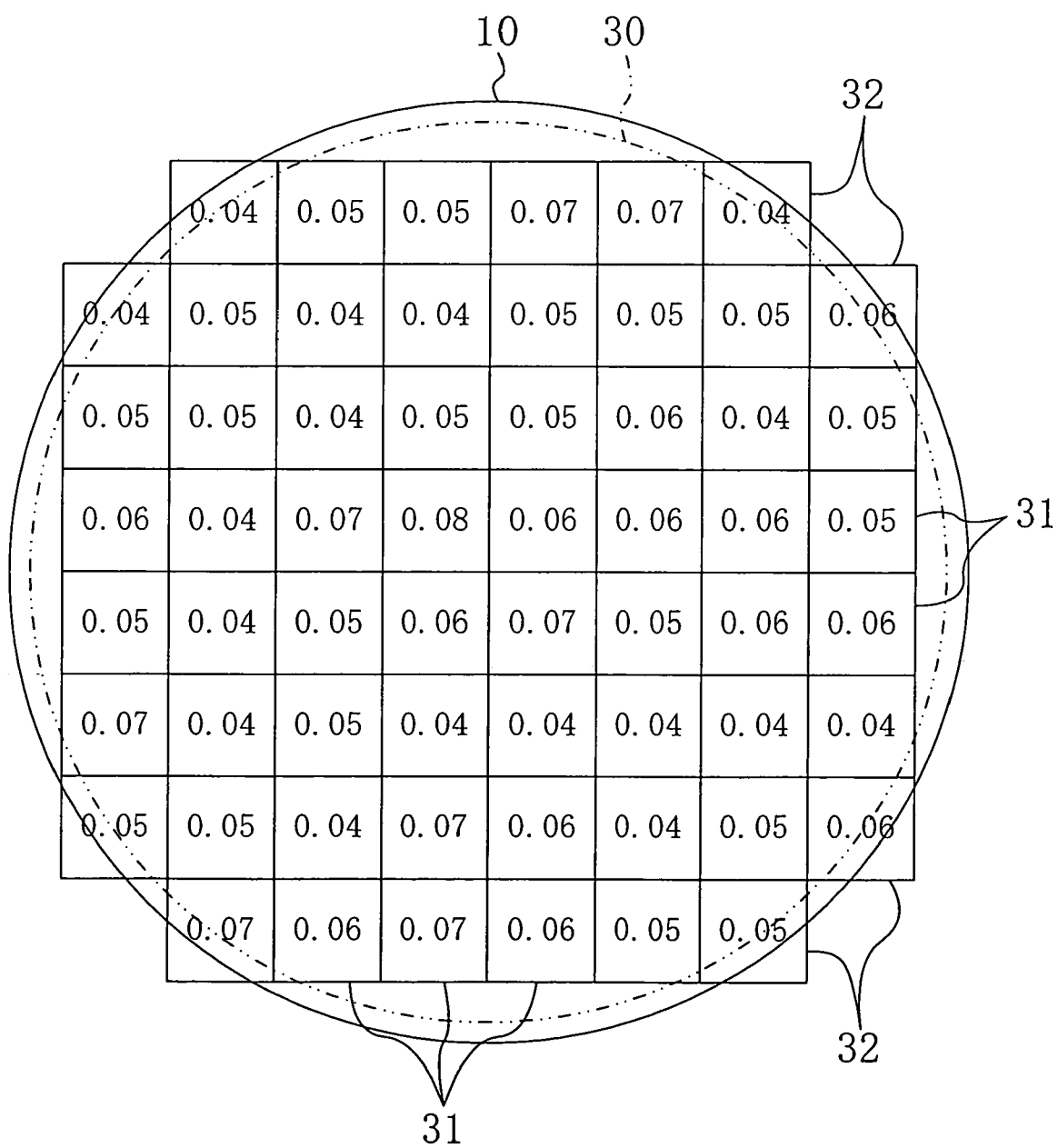
FIG. 4 is a planar illustration showing a site map of a semiconductor substrate used in a method for fabricating a semiconductor device according to the first embodiment of the present invention.

FIG. 4 illustrates a site map in which the principal surface of the subject wafer to be measured is partitioned into a plurality of sites. In FIG. 4, a wafer 10 having a diameter of 200 mm is used as an example, in which the region 3 mm from the periphery of the wafer 10 is an omission region and the inner side of the omission region is a fixed quality area (FQA) 30. Among the plurality of sites, those complete sites included in the FQA 30 are known as full sites 31 while those incomplete sites, each formed by at least three sides of the site and an arc of the FQA 30 with the center included therewithin, are known as partial sites 32. In the case where the diameter of the wafer 10 is 200 mm, the FQA 30 includes 44 full sites 31 and 16 partial sites 32. As shown in FIG. 4, each site includes a respective SFQR value.

Figure 5:
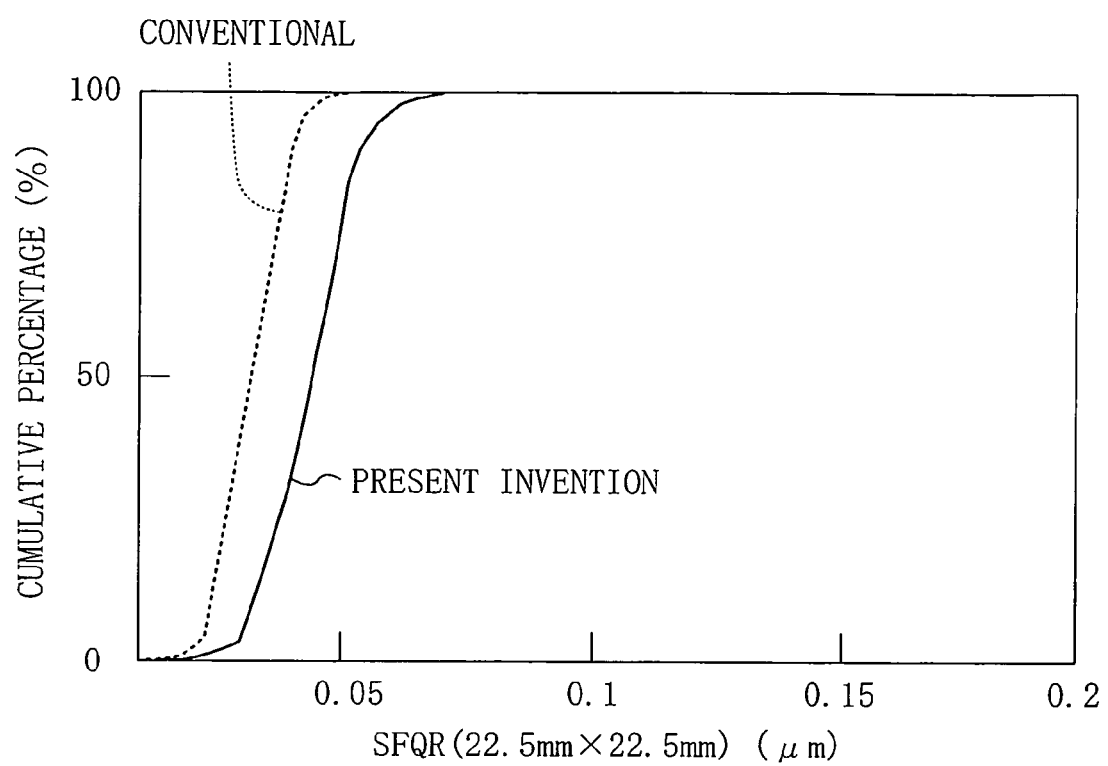
FIG. 5 is a graph showing the results obtained from evaluating the flatness of each wafer using a SFQR value of each site in a semiconductor substrate of the present invention and a conventional semiconductor substrate.

FIG. 5 shows the results obtained from evaluating the flatness of each wafer using the SFQR value of each site in the wafer 10 of the present invention and the conventional wafer 100. Here, the y-axis indicates the SFQR value while the x-axis indicates the cumulative percentage of the SFQR value.

As described above, the wafer 10 related to the present invention is processed such that the flatness on the stepper stage can be attained and the pin chuck 20 is uniformly in contact with the underlying surface 10b of the wafer, by performing a 0.1 μm polishing with respect to the underlying surface 10b by etching using alkaline solution, thereby smoothing the shape of the underlying surface 10b and relatively increasing the cycle length f of the irregularities.

On the other hand, in the case of the conventional wafer 100, after the process of alkaline etching the underlying surface, no polishing is performed. Hence, the irregularities in the underlying surface of the conventional wafer 100 is deeper than those of the wafer 10, and the cycle length of the irregularities of the conventional wafer 100 is also smaller than that of the wafer 10.

In the conventional wafer 100 shown in FIG. 14B, the shape of the long-cycle irregularities in the principal and the underlying surfaces of the conventional wafer 100 are similar, and it can be seen in FIG. 5 that the conventional wafer 100 is more superior in uniformity of thickness as compared to the wafer 10 of the present invention. Hence, from the perspective of the uniformity of thickness, the conventional wafer 100 is superior to the wafer 10 of the present invention in terms of flatness and SFQR values, and thus it can be considered that the conventional wafer 100 is a wafer with high level of flatness.

Next, the results obtained from the measurements of deviation from the virtual focal plane when the wafer 10 and the wafer 100 are respectively held on the stage are shown.

Figure 6:
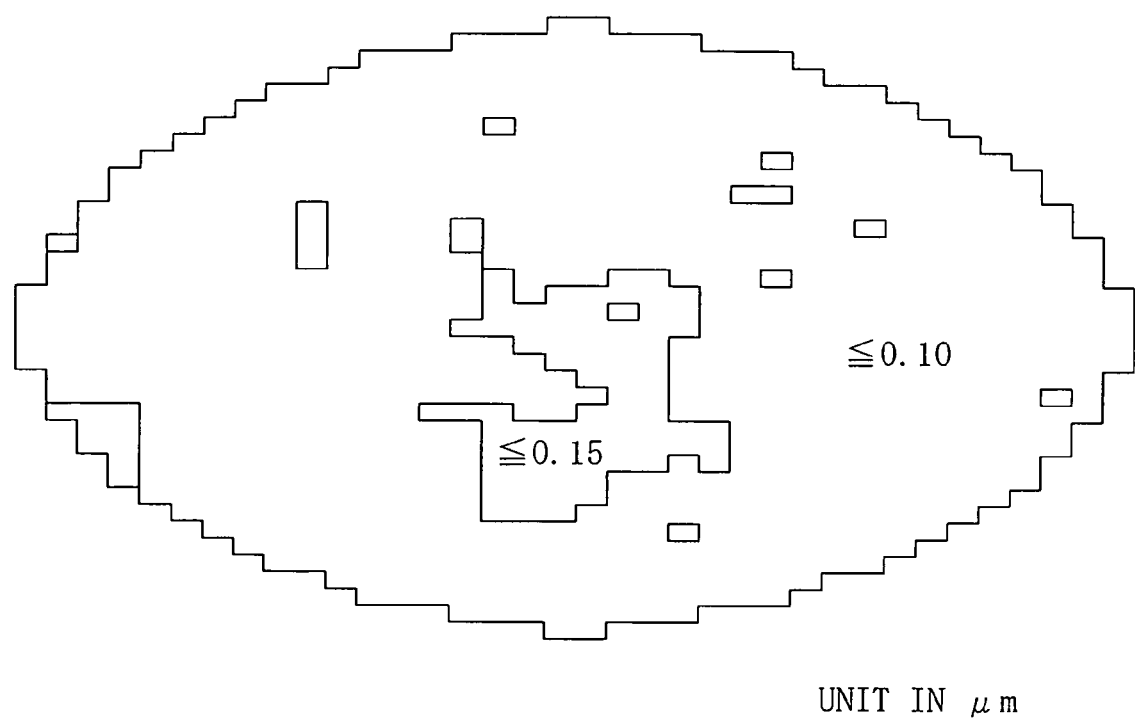
FIG. 6 is a method for fabricating a semiconductor device according to the first embodiment of the present invention, and an illustration showing a distribution of SFQR values within the principal surface of a semiconductor substrate held on a stage.
Figure 7:
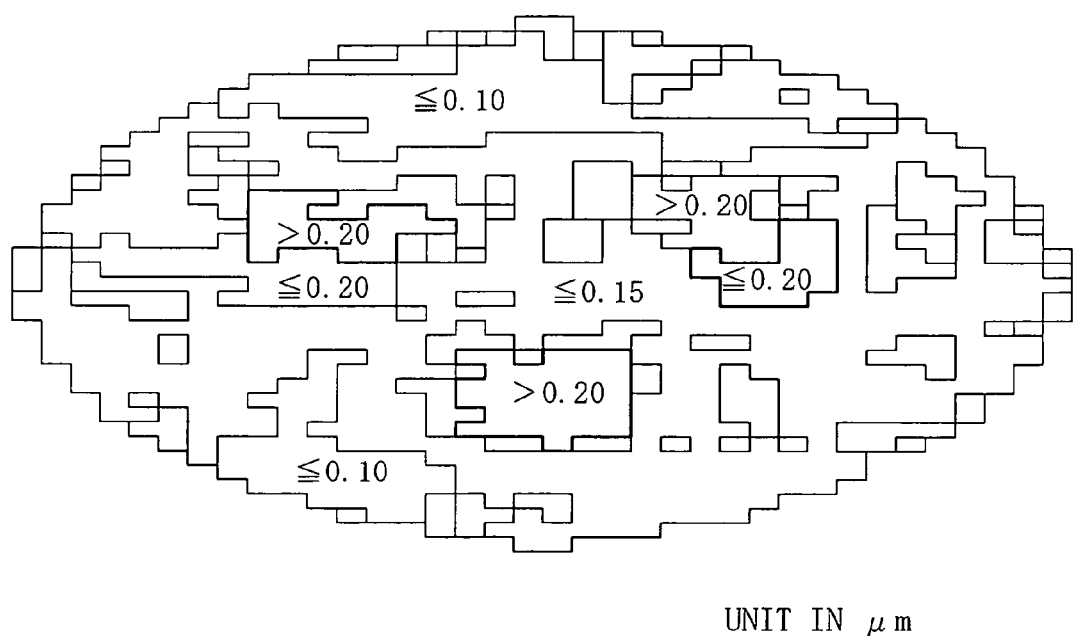
FIG. 7 is an illustration showing a distribution of SFQR values within the principal surface of a conventional semiconductor substrate held on a stage.

FIG. 6 illustrates a distribution of the SFQR values within the principal surface of the wafer 10 related to the present invention, when the wafer 10 is held on the stepper stage. FIG. 7 illustrates a distribution of the SFQR values within the principal surface of the conventional wafer 100, when the wafer 100 is held on the stepper stage. These are the data of the deviation of the principal surface of each wafer from the virtual focal plane directly measured using a focus sensor of the stepper.

According to FIG. 6, the SFQR values across the entire principal surface of the wafer 10 related to the present invention are controlled at 0.15 μm or less. Accordingly, when the wafer 10 related to the present invention is evaluated by the conventional method such as by the uniformity of thickness, the flatness is inferior to that of the conventional wafer 100. However, when the wafer 10 is actually held on the stepper stage, the flatness detected by the exposure optical system is extremely high.

On the other hand, in the conventional wafer 100 shown in FIG. 7, it is observed that the deviation of the focal position in three regions of the principal surface is large, such that the SFQR values exceed 0.20 μm. This shows that even if the uniformity of thickness of the conventional wafer is excellent and the flatness level is high according to the conventional standard, the actual flatness of the wafer 100 on the stepper stage may not be excellent due to the interaction between the underlying surface of the wafer 100 and the stage. Hence as clearly shown in FIG. 7, the focal margin in lithography cannot be determined solely by the flatness of the evaluated wafer 100 in the conventional technology.

Figure 8:
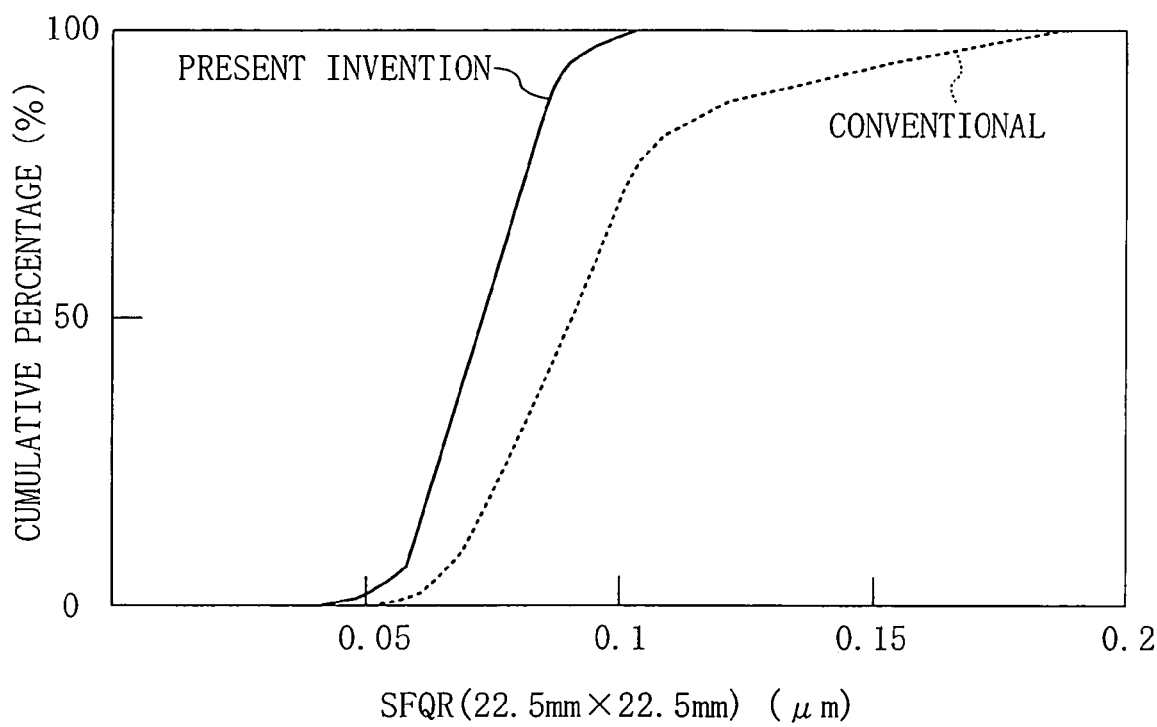
FIG. 8 is a method for fabricating a semiconductor device according to the first embodiment of the present invention, and a graph showing the results obtained by comparing the flatness, evaluated by the SFQR values of the principal surface of a semiconductor substrate of the present invention held on a stage, with a conventional semiconductor substrate.

FIG. 8 shows the SFQR value (x-axis) and the cumulative percentage of the SFQR value (y-axis) of the wafer 10 related to the present invention and those of the conventional wafer 100, when held on a stepper stage. Since the wafer 10 of the present invention is processed such that the interaction between the stepper stage and the underlying surface 10b is decreased, the wafer 10 appears to have an excellent flatness when held on the stepper stage as shown in FIG. 8. Hence a miniaturized design pattern can positively be transferred onto the wafer 10 when the wafer 10 is used, for example, as a wafer composing a miniaturized semiconductor device belonging to the generation having a design rule of 0.15 μm or less.

Figure 9:
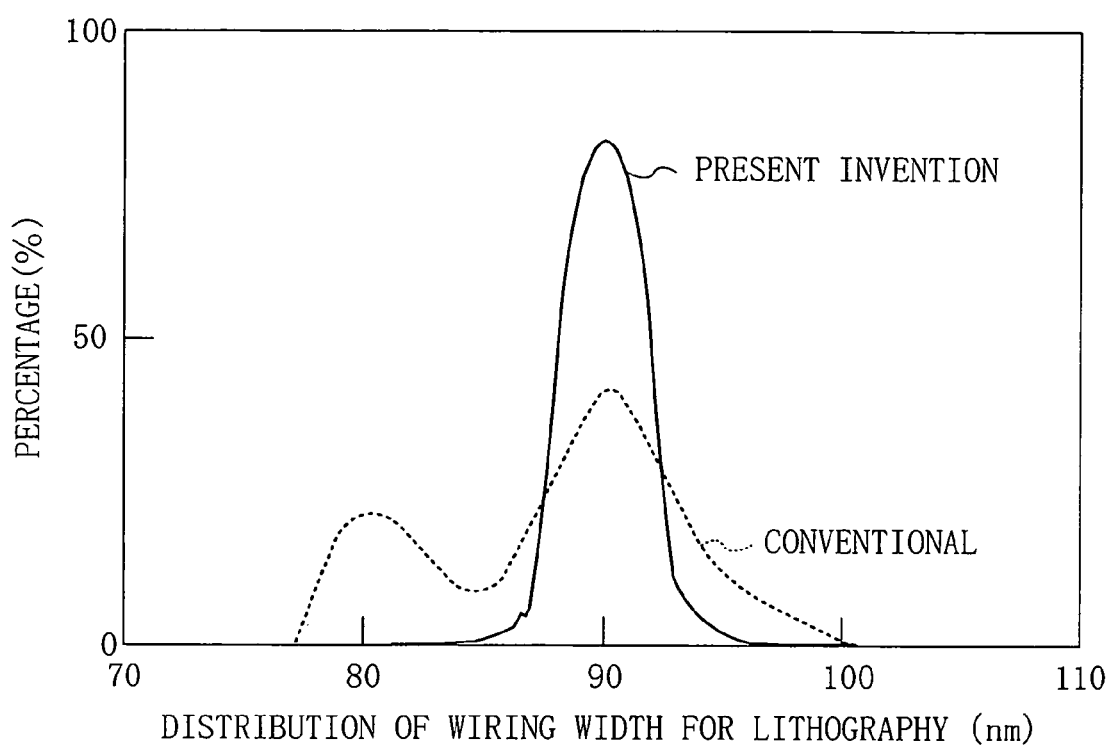
FIG. 9 is a graph showing the results obtained by comparing a dimension distribution, within a surface of a gate pattern having a nominal wiring width of 90 nm formed by a method for fabricating a semiconductor device according to the first embodiment of the present invention, with the case where a conventional semiconductor substrate is used.

FIG. 9 shows the results obtained by comparing a dimension distribution, within a surface of a gate pattern having a nominal wiring width of 90 nm formed by a method for fabricating a semiconductor device using the wafer 10 according to the present invention, with the case where the conventional wafer 100 is used.

As shown in FIG. 9, in the case when the wafer 10 of the present invention is being used, the wiring width of the gate is distributed within ±5 nm of the design value of 90 nm. On the other hand, in the case when the conventional wafer 100 is being used, in addition to main distribution of the design value of 90 nm, other distribution is observed around the 80 nm region.

As described above, according to the first embodiment, since the wafer 10 of which deviation from the focal plane during light exposure is small when held on the stepper stage is used, semiconductor device having miniaturized pattern can be fabricated with stability. Moreover, the flatness of the wafer 10 is not evaluated by the individual wafer 10, it has been demonstrated that the flatness of the wafer 10 when being held on the stepper greatly affects the lithography process.

In addition, the present invention is not only limited to the case when a sequential exposure mode stepper or a scanner mode stepper is used, but is also effective, for example, in light exposure device for batch processing of wafer such as projection exposure device or proximity exposure device.

(Second Embodiment)

Hereinafter, the second embodiment of the present invention is described with reference to the drawings. A method for fabricating the wafer (semiconductor substrate) used in the method for fabricating the semiconductor device according to the first preferred embodiment is specifically described in the second embodiment.

Figure 10:
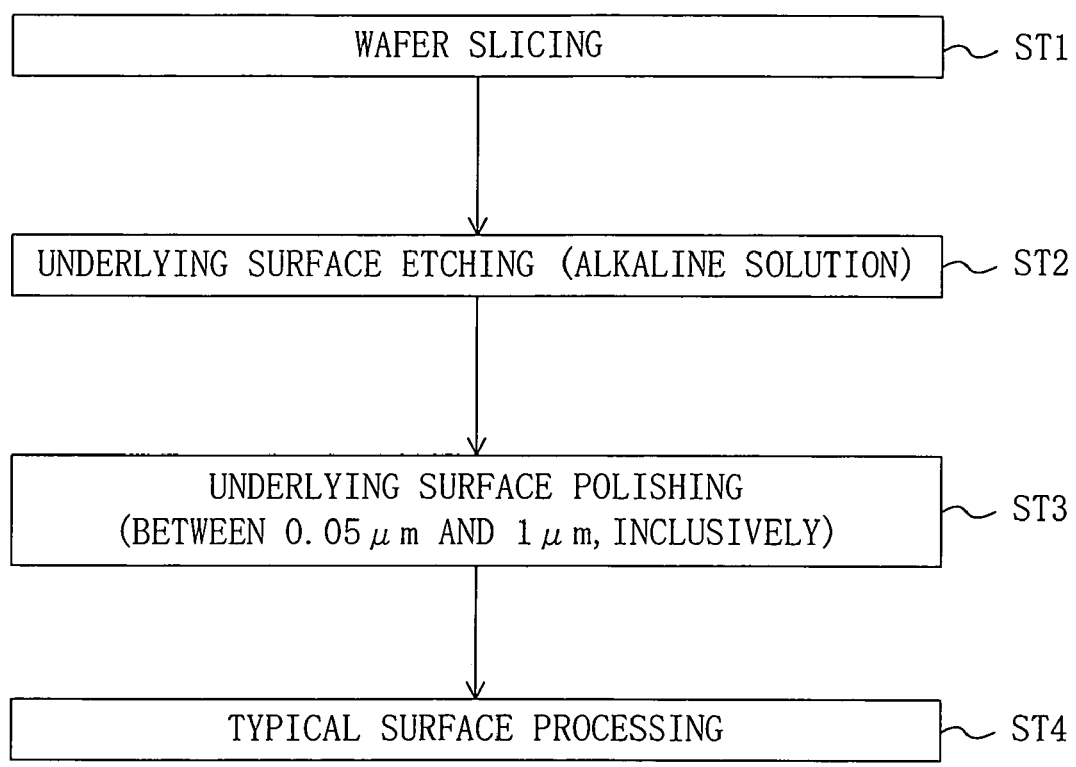
FIG. 10 is a diagram showing the flow of a method for fabricating a semiconductor substrate according to the second embodiment of the present invention.

FIG. 10 illustrates the flow of the method for fabricating the semiconductor substrate according to the second embodiment.

Typically, for example, after a wafer is being cut from a cylindrical ingot made of silicon, an acidic etching solution is used to remove the process damage on the cut surface of the wafer. However in the second embodiment, as shown in the slice step ST1 of FIG. 10, etching is performed using an alkaline etching solution to reduce the roughness on the underlying surface of the wafer.

Generally, a mixed solution of nitric acid ($H_2NO_3$) and hydrofluoric acid (HF) is used in acidic etching solution, and etching process using such mixed solution includes a 2-stages reaction of oxidizing a silicon surface to form a silicon oxide film and subsequently removing the formed silicon oxide film, and at the same time an exothermic reaction. According to such etching process, irregularities having a relatively small cycle length are produced on the underlying surface of the wafer, and the irregularities are quite intense when microscopically observed.

On the other hand, in the etching step ST2 for underlying surface of the second embodiment, a wet etching is performed using alkaline solution represented by, for example, potassium hydroxide (KOH), sodium hydroxide (NaOH) or the like. The wet etching by such alkaline solution is an anisotropic etching, and a plurality of facets are produced on the underlying surface of the wafer due to the gentle reaction. Such plurality of facets form irregularities having a relatively large cycle length.

In the polishing step ST3 for underlying surface, the underlying surface of the wafer is polished to further increase the cycle length of the irregularities on the underlying surface, and the polishing amount is between 0.05 μm and 1 μm, inclusively. Due to such polishing of the underlying surface, the cycle length of the irregularities on the underlying surface of the wafer changes, and in addition, the size and depth of the facets produced by the alkaline etching also change. Since small facets of the plurality of facets may disappear due to such polishing of the underlying surface, the concentration of facets may also changes. Such polishing amount of the underlying surface cannot be firmly determined, and when the subject wafer for exposure is held on the stepper stage, the cycle length f of the irregularities, the depth Ra of the pit and the concentration of the facets are adjusted such that the deviation from the virtual focal plane of the stepper is minimized. Generally, it is also applicable to the chucks having various shapes in the stepper stage according to the increase in polishing amount of the underlying surface. In such case, although the polishing amount can be more than or equal to 1 μm, the underlying surface will also become similar to a mirror surface, and if the polishing of the underlying surface is continued further, a 2-sided polished wafer can be obtained.

Next, in the surface processing step ST4, a typical mirror surface processing is performed to the (principal) surface of the wafer.

Figure 11:
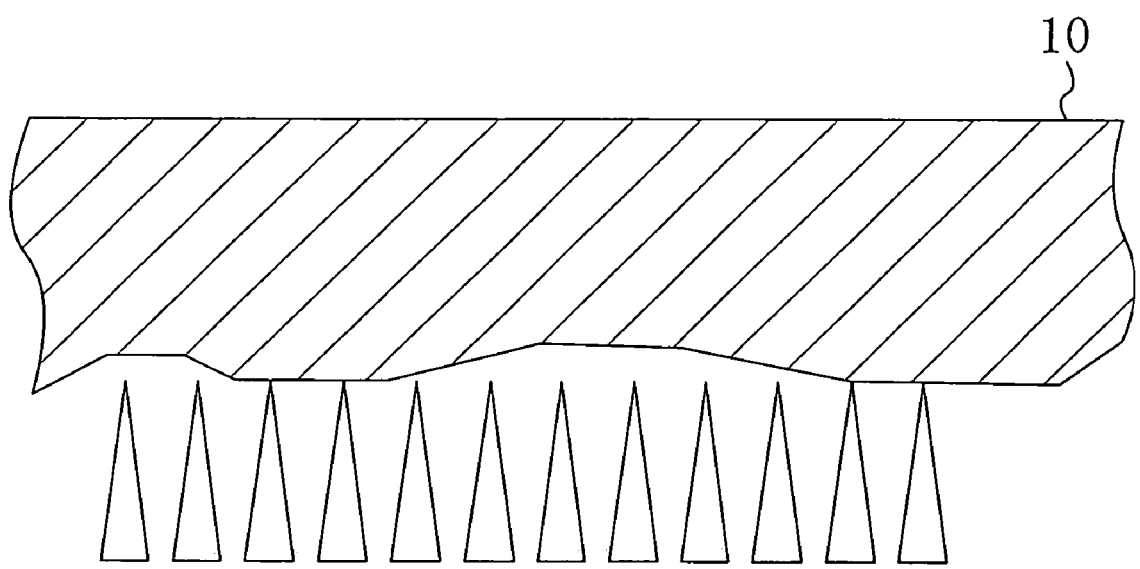
FIG. 11 is an enlarged cross-sectional illustration showing a part of a semiconductor substrate according to the second embodiment of the present invention.
Figure 12:
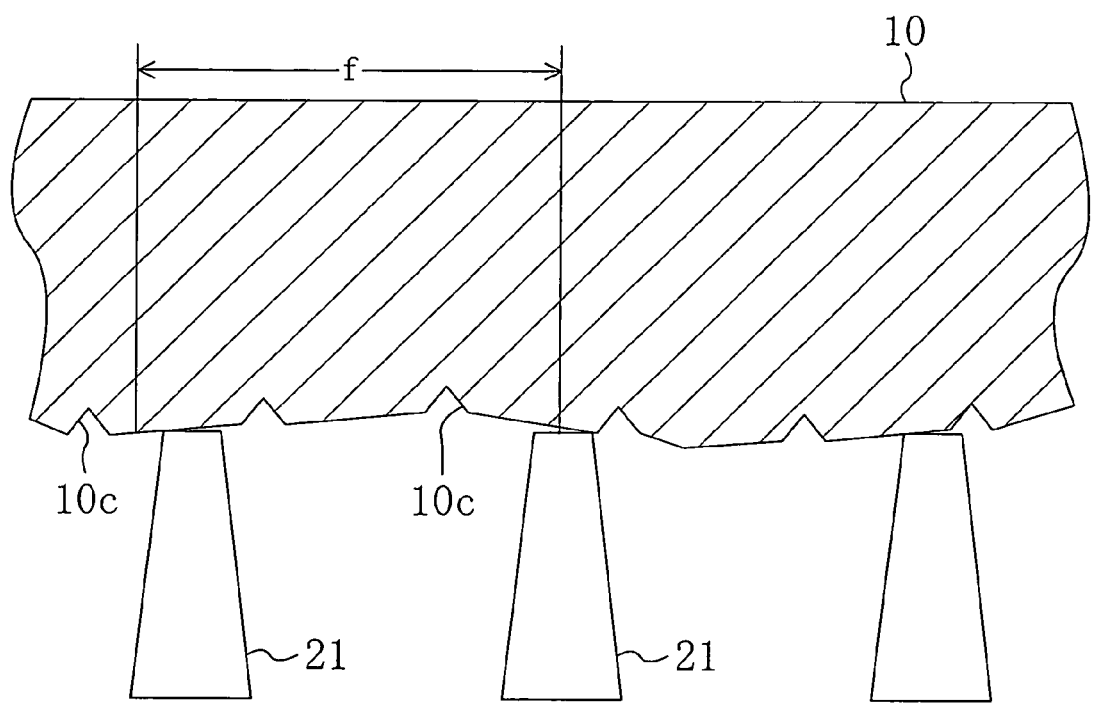
FIG. 12 is an enlarged cross-sectional illustration showing a part of FIG. 11.

FIG. 11 is an enlarged cross-sectional illustration of the wafer 10 according to the second embodiment, and FIG. 12 an enlarged cross-sectional illustration of part of FIG. 11.

As described above, the flatness of the wafer on the stepper stage is not only determined by the uniformity in thickness of the wafer, but also the interaction between the wafer and the chuck composing the stage, and especially the shape of the underlying surface of the wafer. Naturally, the interaction between the wafer and the stepper stage depends on the flatness of the stepper stage, and in an ideal situation, if the stepper stage has an extremely high level of flatness, the interaction then depends on the flatness of the wafer.

However, a realistic stage does not possess an ideal flatness and each stage varies from another. Moreover, there are different types of chuck such as the ring chucks and the pin chucks, and each has its own feature. In any case, it is only practical to decrease the interaction between the stage and the underlying surface of the wafer, or to improve the flatness of the wafer on the stepper stage by compensating the imperfect flatness of the stage with the shape of the of the underlying surface of the wafer.

Hence in the second embodiment and as shown in FIG. 11 and FIG. 12, it is ideal if the interaction between the underlying surface of the wafer and the stepper stage can be decreased by performing a mirror polishing to the underlying surface such as to the principal surface of the wafer, or achieving an underlying surface similar to a mirror surface.

As shown in FIG. 12, in the case of pin chuck, it is preferable that the diameter of the opening of the pits 10c is smaller than the top surface of the support pins 21, and the cycle length f of the irregularities is larger than or equal to the distance between the support pins 21. This is because, when the diameter of the opening of the pits 10c is larger than or equal to the top surface of the support pins 21, there is a possibility that some of the support pins 21 are inserted into the pits 10c while others are not, and when the cycle length f of the irregularities is smaller than the distance between the support pins 21, there is a possibility that the top surface of some of the support pins 21 is not in contact with the underlying surface of the wafer.

Specifically, the cycle length f of the irregularities is set at 300 μm or more, which is larger than the typical distance of 200 μm between the support pins 21, and the arithmetic mean of the depth of the irregularities and the depth Ra of the pit 10c is set at 200 nm or less. As a result, the interaction between the wafer 10 and the support pins 21 can be decreased.

Figure 13:
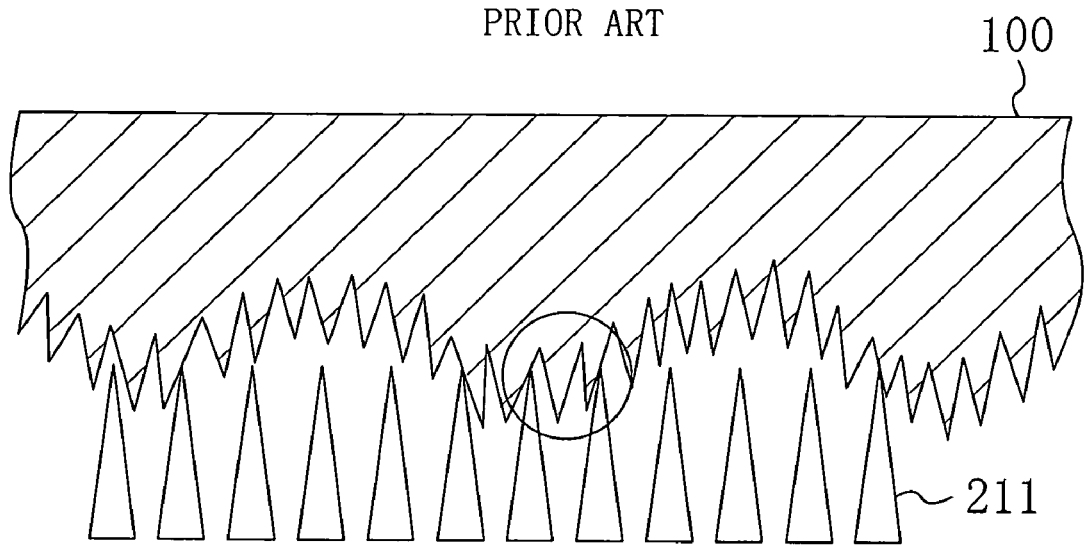
FIG. 13 is an enlarged illustration showing a part of a conventional semiconductor substrate.

For comparison, FIG. 13 shows an enlarged illustration of a wafer 100 being held on a pin chuck. The underlying surface of the conventional wafer 100 has irregularities of a relatively small cycle length of about 150 μm–300 μm, and the irregularities are very close to the distance of 200 μm between the pins 211. Hence, since the top portion of some of the pins 211 is in contact with the depressed portions and the protruding portions of the irregularities having a relatively small cycle length on the underlying surface of the wafer 100, the flatness of the principal surface of the wafer 100 worsen.

In the second embodiment, even though the conventional wafer 100 and the depth Ra of the pit 10c look the same, a substantial flatness of the wafer 10 on the stage can be ensured by adjusting the cycle length f of the irregularities on the underlying surface of the wafer 10.

Moreover, the composition of the wafer 10 is not limited to bulk silicon, but the wafer 10 can also be a SOI (Silicon on Insulator) substrate.

The methods for fabricating the semiconductor device and for fabricating the semiconductor substrate used in the semiconductor device according to the present invention have the effect of transferring miniaturized desirable design pattern to the semiconductor substrate (wafer) to achieve high performance and high reliability semiconductor device. The present invention is applicable to method for fabricating semiconductor device that require miniaturized pattern, such as for example, MOS device or charge-coupled device (CCD), and method for fabricating semiconductor substrate used in such semiconductor device.

What is claimed is:

1. A method for fabricating a semiconductor device comprising the steps of:
   (a) mounting a semiconductor wafer on a wafer chuck and holding the semiconductor wafer by letting an underlying surface of the semiconductor wafer, the underlying surface being opposite to a principal surface of the semiconductor wafer, absorb on the wafer chuck by vacuum absorption; and
   (b) transferring a design pattern onto the principal surface of the semiconductor wafer by exposing an exposure light, which passes through a mask having the design pattern, onto the principal surface of the semiconductor wafer held on the wafer chuck,
   wherein the underlying surface, has irregularities with cross-sectional cycle lengths of 300 μm or more and depressions with opening diameters of 100 μm or less, and is formed such that an arithmetic mean of depths of the irregularities and depths of the depressions is 200 nm or less, and
   in the step (b), differences in distance between a focal position of the exposure light and the principal surface of the semiconductor wafer held on the wafer chuck are set at 50% or less of a design rule.

2. The method of claim 1, wherein the principal surface of the semiconductor wafer is partitioned into a plurality of quadrilateral sites,
   the step (b) further includes a sub-step of sequentially exposing each partitioned site to the exposure light, and
   among the plurality of sites of which each center is included on the principal surface of the semiconductor wafer, differences in distance between a virtual focal plane of the exposure light and the principal surface of the semiconductor wafer held on the wafer chuck are 120% or less of a design rule determining the design pattern, when displayed by a Site Flatness Front Side Reference Least Square Range (SFQR) method.

3. The method of claim 1, wherein in the step (b), a support portion of the wafer chuck uniformly contacts the underlying surface of the semiconductor wafer.

4. The method of claim 3, wherein the semiconductor wafer is compressed onto the support portion of the wafer chuck by atmospheric pressure, and
   the support portion is a pin chuck composed of a plurality of pin-shaped components or a ring chuck composed of a plurality of concentric components, each pin-shaped component or concentric component is provided apart from each other such that the top surface of each pin-shaped component or concentric component opposes the underlying surface of the semiconductor wafer.

* * * * *